(12) United States Patent
Solak et al.

(10) Patent No.: US 9,182,672 B2
(45) Date of Patent: Nov. 10, 2015

(54) SYSTEM AND METHOD FOR PRODUCTION OF NANOSTRUCTURES OVER LARGE AREAS

(75) Inventors: Harun Solak, Brugg (CH); Francis Clube, Hausen (CH)

(73) Assignee: Eulitha AG, Villigen/PSI (CH)

( * ) Notice: Subject to any disclaimer, the term of this patent is extended or adjusted under 35 U.S.C. 154(b) by 131 days.

(21) Appl. No.: 13/997,335

(22) PCT Filed: Dec. 20, 2011

(86) PCT No.: PCT/IB2011/055827
§ 371 (c)(1),
(2), (4) Date: Aug. 23, 2013

(87) PCT Pub. No.: WO2012/085845
PCT Pub. Date: Jun. 28, 2012

(65) Prior Publication Data
US 2013/0323651 A1    Dec. 5, 2013

Related U.S. Application Data

(60) Provisional application No. 61/426,719, filed on Dec. 23, 2010.

(51) Int. Cl.
G03F 7/20    (2006.01)
(52) U.S. Cl.
CPC ............ *G03F 7/201* (2013.01); *G03F 7/70408* (2013.01)
(58) Field of Classification Search
CPC .... G03F 7/201; G03F 7/70091; G03F 7/0141
See application file for complete search history.

(56) References Cited

U.S. PATENT DOCUMENTS

| 2008/0186579 | A1 | 8/2008 | Solak |
| 2011/0199598 | A1 | 8/2011 | Solak et al. |
| 2012/0009525 | A1 | 1/2012 | Clube et al. |

(Continued)

FOREIGN PATENT DOCUMENTS

| WO | 2006045439 A2 | 5/2006 |
| WO | 2010060741 A1 | 6/2010 |

(Continued)

OTHER PUBLICATIONS

Gamet, E., et al., "Flying phase mask for the printing of long submicron period stitch-less gratings", Microelectronic Engineering, Apr. 2006, pp. 734-737, vol. 83, No. 4-9, Elsevier Science Ltd., Oxford, UK URL: http://hal-ujm.ccsd.cnrs.fr/docs/00/35189/01/PDF/flying_phase_mask_MNE.pdf.

*Primary Examiner* — Kathleen Duda
(74) *Attorney, Agent, or Firm* — Laurence A. Greenberg; Warner H. Stemer; Ralph E. Locher

(57) ABSTRACT

A method and an apparatus print a pattern of periodic features into a photosensitive layer. The methods includes the steps of: providing a substrate bearing the layer, providing a mask, arranging the substrate such that the mask has a tilt angle with respect to the substrate in a first plane orthogonal thereto, and providing collimated light for illuminating the mask pattern so as to generate a transmitted light-field composed of a range of transversal intensity distributions between Talbot planes separated by a Talbot distance so that the transmitted light-field has an intensity envelope in the first plane. The mask is illuminated with the light while displacing the substrate relative to the mask in a direction parallel to the first plane and to the substrate. The tilt angle and the intensity envelope are arranged so that the layer is exposed to an average of the range of transversal intensity distributions.

14 Claims, 5 Drawing Sheets

(56) References Cited

U.S. PATENT DOCUMENTS

2012/0092635 A1 4/2012 Solak et al.
2012/0214104 A1* 8/2012 Suzuki et al. ................. 430/322

FOREIGN PATENT DOCUMENTS

WO 2012004745 A1 1/2012
WO 2012049638 A1 4/2012

* cited by examiner

SYSTEM AND METHOD FOR PRODUCTION OF NANOSTRUCTURES OVER LARGE AREAS

CROSS-REFERENCE TO RELATED APPLICATION

This is a continuation application, under 35 U.S.C. §120, of copending international application No. PCT/IB2011/055827, filed Dec. 20, 2011, which designated the United States; this application also claims the priority, under 35 U.S.C. §119(e), of provisional application No. 61/426,719, filed Dec. 23, 2010; the prior applications are herewith incorporated by reference in their entireties.

BACKGROUND OF THE INVENTION

Field of the Invention

This invention relates generally to the field of photolithography as employed for the fabrication of micro- and nano-structures, and it relates particularly to the field of photolithography based on the Talbot effect, or self-imaging.

Micro- or nano-structures with feature sizes typically in the range of 10 nm-10 um are required for many applications. Such structures should be formed over surfaces whose area varies from a few square-millimeters to many square meters. Applications include flat panel displays and solar panels.

Lithographic techniques have been proposed for the fabricating such structures over large areas, for example, nano-imprint lithography using master stamps and contact photolithography using roller masks. Nano-imprint lithography requires contact between the mask and the substrate to be printed, and is therefore sensitive to defects since non-perfect contact between the master and substrate degrades the uniformity of the printed pattern. Defects arise because of particles that may be introduced by the master or the substrate to be patterned. Furthermore, uneven pressure applied to the substrate, or deformations of the substrate or the master may also introduce undesirable defects. In addition, residual polymer left on the master after an imprint process has to be removed before transferring the pattern onto a subsequent substrate. Such residues often have a non-uniform thickness which further exacerbates this problem. Photolithography through transparent roller masks, which has recently been introduced, also relies on physical contact between the mask and the substrate. In this case, non-perfect contact reduces the contrast and definition of the image because of diffraction of the light between the mask and substrate.

A photolithographic method for printing large high-resolution grating patterns from smaller patterns in a mask is described in E. Gamet et al., "Flying phase mask for the printing of long submicron-period stitch-less gratings", Microelectronic Engineering 83 (2006) 734-737 and in the international patent application WO 2010/060741 A1 by Jourlin et al. According to this scheme a phase mask bearing a grating of relatively small area is positioned in proximity and parallel to a much larger substrate coated with a layer of photoresist. The exposure is performed by translating the substrate laterally with respect to the mask in a direction orthogonal to the grating lines whilst illuminating the mask with an intensity-modulated laser beam. The modulation frequency is synchronized with the speed of displacement so that the substrate displaces by a distance corresponding to the period of the grating between successive illumination pulses, whereby the intensity maxima in the interferograms projected from the mask by successive pulses are superposed on the substrate. An encoder-based optical system is additionally employed for measuring the speed of substrate displacement in order to ensure that the modulation-frequency is synchronized with the required accuracy. A sensor is also integrated for measuring possible yaw of the stage during its displacement so that it can be compensated by a tilt actuator that slightly adjusts the orientation of the phase mask during the translation of the substrate. These disclosures further describe that the mask may be illuminated at normal incidence, in which a 0th and two 1st diffraction orders are generated, or at the Littrow angle so that only the 0th and one 1st order propagate.

One of the inventors has devised two methods based on the Talbot effect for printing high-resolution periodic patterns in a cost effective way. The first of these is achromatic Talbot lithography (see H. H. Solak, et al., "Achromatic Spatial Frequency Multiplication: A Method for Production of Nanometer-Scale Periodic Structures", J. Vac. Sci. Technol., 23, pp. 2705-2710 (2005), and European pat. no. EP1810085). It offers two significant advantages for lithographic applications. Firstly, it overcomes the depth-of-field limitation encountered using the classical Talbot method; and, secondly, for many pattern types it enables a spatial-frequency multiplication, that is, it permits the period of the printed features to be smaller than that of the features in the mask. In achromatic Talbot lithography (ATL) the mask is illuminated with a collimated beam that has a relatively broad spectral bandwidth, and beyond a certain distance from the mask the transmitted light-field forms a so-called stationary image whose intensity distribution is invariant to further increase in distance. The minimum distance, $d_{min}$, from the mask at which this occurs is related to the period of the pattern, p, in the mask and to the spectral bandwidth of the illumination, $\Delta\lambda$. In the case of a one-dimensional periodic pattern, i.e. a linear grating, it is given by:

$$d_{min} \approx 2p^2/\Delta\lambda \qquad \text{equ. (1)}$$

Beyond this distance, the Talbot image planes for the different wavelengths are distributed in a continuous manner, which generates the stationary image. Thus, placing a photoresist-coated substrate at a distance from the mask that is $\geq d_{min}$ is equivalent to exposing it to the entire range of transverse intensity distributions that are formed between successive Talbot planes when illuminating the mask with a single wavelength. The pattern printed onto the substrate is therefore an average, or integration, of this range of transversal intensity distributions, and this is substantially insensitive to longitudinal displacement of the substrate with respect to the mask. The technique enables a much larger depth of field than standard Talbot imaging, and a much larger depth of field than conventional projection, proximity or contact printing.

The intensity distribution in an ATL image from a particular mask pattern may be determined using modelling software that simulates the propagation of electromagnetic waves through and after the mask. Such simulation tools may be used to optimize the design of the pattern in the mask for obtaining a particular printed pattern at the substrate surface.

The ATL method has been developed primarily to print periodic patterns that comprise a unit cell that repeats with a constant period in at least one direction. The technique may, however, also be successfully applied to patterns whose period spatially varies in a sufficiently "slow", gradual way across the mask such that the diffraction orders that form a particular part of the stationary image are generated by a part of the mask in which the period is substantially constant. Such patterns may be described as being quasi-periodic.

A drawback of ATL is that it requires a light source with a sufficient spectral bandwidth in order that the separation required between the mask and substrate is not disadvantageously large. The angular divergence of the different diffracted orders propagating from the mask results in imperfect overlap, and therefore imperfect reconstruction of the self-images, at the edges of the pattern, and these get worse with increasing separation. Fresnel diffraction of the transmitted light-field at the edges of the mask pattern also degrades the edges of the printed pattern, and this likewise gets worse with increasing separation. For these reasons laser sources, which have relatively small spectral bandwidth, are in most cases unsuitable for ATL.

A difficulty with applying non-laser sources such as arc lamps or light emitting diodes to ATL is obtaining an illumination beam with the combination of high power (for ensuring high throughput in a production process) and good collimation (for ensuring high-contrast imaging and minimizing loss of feature resolution). Obtaining good collimation from these sources requires spatial filtering of the output beam which can lead to unacceptable loss of power.

The advantages of the ATL technique may be obtained using the second of two techniques recently introduced by one of the inventors (see U.S. Pat. Appl. no. 2008/0186579. In this scheme, the periodic pattern in the mask is illuminated by a collimated beam of monochromatic light and during exposure the distance of the substrate from the mask is varied over a range corresponding to an integer multiple of the separation between successive Talbot image planes in order that an average of the intensity distributions between Talbot planes is printed on the substrate. The smallest displacement that may be employed is therefore equal to the separation of successive Talbot planes (when integer=1). With this displacement during exposure, the pattern printed on the substrate is substantially the same as that printed using the ATL technique. It is disclosed that the displacement may be performed either continuously or in a discrete way by exposing the substrate at multiple discrete positions over the range. Using the continuous displacement, the speed of displacement is necessarily constant in order that the desired average of the transversal intensity distributions is obtained, and using the discrete, or stepped, displacement, the exposure dose at each discrete position should necessarily be the same for the same reason. The general technique may be referred to as displacement Talbot lithography (DTL)

The average intensity distributions generated at the substrate using the ATL and DTL techniques are essentially equivalent, and both enable a large depth of field and spatial-frequency multiplication for the printed pattern. The DTL scheme can be used with much smaller separations of the substrate and mask than the ATL scheme. This reduces the degradation of the pattern edges and allows more efficient utilization of the output from the light source because of the less stringent requirement on collimation. Further, the DTL technique enables the use of laser sources, which may be preferred for production processes. The light from such sources can be formed into well-collimated beams with negligible loss of power, so minimize loss of feature resolution and maximize image contrast.

The structure of the patterns printed using DTL from a particular mask pattern may also be theoretically determined using simulation software.

The DTL technique described in U.S. pat. appl. no. 2008/0186579 requires that the longitudinal displacement of the substrate relative to the mask during exposure corresponds to an integer multiple of the Talbot distance. When the displacement is an integer multiple, the average intensity distribution exposing the substrate is independent of the initial separation of the substrate and mask, and so produces a uniform exposure of the pattern features on the substrate even if the mask and substrate are not accurately flat and parallel. If, on the other hand, the displacement is not an integer multiple of the Talbot distance because of, for example, mechanical hysteresis or limited stepping resolution of a displacement actuator, or because of inexact synchronization between the duration of the exposure by the illumination system and the displacement of the substrate, then the average intensity distribution depends on the initial separation. In this case, if the mask and substrate are not accurately flat and parallel, then a spatial variation of feature size is introduced into the printed pattern; or, if the mask and substrate are accurately flat and parallel but their separation is different for different substrates, then the size of the printed features varies from substrate to substrate; both of which may be problems for certain applications. These variations of feature size may be reduced by longitudinally displacing the substrate by a large number of Talbot distances relative to the mask, but this can introduce other problems such as degradation of the feature resolution (if the illumination beam is not well collimated), distortion of the feature shape (if the direction of displacement is not accurately longitudinal), degradation of the pattern edges (if the gap becomes too large), and disadvantageously requires larger travel range in the mechanical system.

International pat. appl. no. PCT/IB2011/054509 teaches a modification of the DTL technique for overcoming this limitation, so as to enable periodic or quasi-periodic patterns to be printed uniformly and reproducibly without the requirement that the longitudinal displacement of the substrate relative to the mask during exposure corresponds to an integer multiple of the Talbot distance. It teaches that at least one of the rate of change of separation of the mask and substrate and the intensity of the illuminating beam should be varied during the exposure so that the mask is illuminated by an energy density per incremental change of separation that varies over the changing separation. It teaches that it is particularly advantageous if the energy density per incremental change of separation varies according to a Gaussian distribution.

U.S. patent application Ser. No. 12/706,081 teaches an enhancement of the ATL and DTL techniques in which the periodic or quasi-periodic pattern of features in the mask is instead illuminated with a beam having an angular distribution of illumination, whereby each of the angular components of the illuminating beam exposes the photoresist to the range of lateral intensity distributions that occur between successive Talbot image planes, so that the resultant intensity distribution exposing the photoresist corresponds to a convolution of the angular distribution of the illuminating beam with the average intensity distribution produced using collimated illumination. This method allows a greater flexibility for the shapes of the printed features and also enables a multiplication of the number of printed features within each unit cell of the periodic pattern and a reduction of the pattern period in at least one direction. The latter, however, requires a relatively small duty cycle for the transparent features in the mask, which can be undesirable if the mask needs to have high transmission in order to achieve a short printing time for a manufacturing process.

International pat. appl. no. PCT/IB2011/052977 teaches a technique related to ATL and DTL in which a grating pattern of parallel lines and spaces in a mask is illuminated with substantially monochromatic light over a range of angles of incidence in a plane parallel to the grating lines, and at substantially a single angle of incidence in an orthogonal plane of incidence, so that the light of each angle of incidence transmitted by the mask forms a light-field component at a photosensitive layer on a substrate located parallel and in proximity to the mask, whereby the integration of said components prints the desired pattern; wherein the range of angles is selected in relation to the wavelength, the separation of the mask and substrate and the period of the grating so that the integration of said components is substantially equivalent to an average of the range of transversal intensity distributions formed between Talbot image planes by light at one of the angles of incidence.

A characteristic of the ATL and DTL techniques described in the prior art and in the above-mentioned unpublished patent applications is that the overall size of the periodic pattern in the mask should be the same as that of the pattern required on the substrate. Whereas this is generally acceptable if the area over which the high-resolution pattern required is reasonably small (e.g. up to 100 mm×100 mm), it can be a major problem for much larger patterns on account of the cost and/or manufacturability of the mask. A solution to this problem would be use a smaller area pattern in the mask and to employ a step-and repeat exposure strategy for printing over a much larger area on a substrate, but this requires a complex mechanical system for performing the exposures and accurately stitching together the sub-fields, and the stepping motion of the substrate (or mask) is undesirable for a high productivity process; and even with a step-and-repeat exposure scheme the size of the pattern in the mask may need to be large in order to limit the number of exposure steps to a reasonable number.

BRIEF SUMMARY OF THE INVENTION

It is therefore a first object of the present invention to provide a method based on the ATL and DTL techniques (so that it provides a non-contact exposure with large depth-of-focus) that enables one-dimensional and two-dimensional patterns of periodic and quasi-periodic features to be printed over large substrates and which is suitable for a high-productivity process.

It is a second object of the present invention to provide an apparatus based on the ATL and DTL techniques (so that it provides a non-contact exposure with a large depth-of-focus) that enables one-dimensional and two-dimensional patterns of periodic and quasi-periodic features to be printed over large substrates and which is suitable for a high-productivity process.

It is a third object of the present invention to provide a method based on the ATL and DTL techniques (so that it provides a non-contact exposure with a large depth-of-focus) that is suitable for printing large patterns and requires a relatively small and readily manufacturable amplitude or phase shifting type mask.

It is a fourth object of the present invention to provide a method based on the ATL and DTL techniques (so that it provides a non-contact exposure with a large depth-of-focus) that is suitable for printing large patterns and requires an illumination beam that is relatively small.

It is a fifth object of the present invention to provide a method based on the ATL and DTL techniques (so that it provides a non-contact exposure with a large depth-of-focus) that is suitable for printing large patterns and enables the suppression of coherent speckle as may be produced by a laser light source.

According to a first aspect of the present invention a method is provided for printing a desired pattern of periodic features into a photosensitive layer, including the steps of:
 a) providing a substrate bearing the photosensitive layer;
 b) providing a mask bearing a mask pattern of periodic features;
 c) arranging the substrate in proximity to the mask and so that it has a tilt angle with respect to the substrate in a first plane orthogonal thereto;
 d) providing substantially collimated light for illuminating said mask pattern so as to generate a transmitted light-field composed a range of transversal intensity distributions between Talbot planes separated by a Talbot distance, and so that said transmitted light-field has an intensity envelope in the first plane;
 e) illuminating the mask with said light whilst displacing the substrate relative to the mask in a direction that is substantially parallel to both the first plane and the substrate, whereby the desired pattern is printed into the photosensitive layer;
 wherein the tilt angle and the intensity envelope are arranged in relation to the Talbot distance so that the photosensitive layer is substantially exposed to an average of the range of transversal intensity distributions.

According to a second aspect of the present invention an apparatus is provided for An apparatus for printing a desired pattern of periodic features into a photosensitive layer, which includes:
 a) a substrate bearing the photosensitive layer;
 b) a mask bearing a mask pattern of periodic features;
 c) means for arranging the substrate in proximity to the mask and so that it has a tilt angle with respect to the substrate in a first plane orthogonal thereto;
 d) means for illuminating said mask pattern with substantially collimated light so as to generate a transmitted light-field composed a range of transversal intensity distributions between Talbot planes separated by a Talbot distance, and so that said transmitted light-field has an intensity envelope in the first plane;
 e) means for displacing the substrate relative to the mask in a direction that is substantially parallel to both the first plane and the substrate, whereby the desired pattern is printed into the photosensitive layer;
 wherein the tilt angle and the intensity envelope are arranged in relation to the Talbot distance so that the photosensitive layer is substantially exposed to an average of the range of transversal intensity distributions.

BRIEF DESCRIPTION OF THE SEVERAL VIEWS OF THE DRAWING

Preferred examples of the present invention are hereinafter described with reference to the following figures.

DESCRIPTION OF THE INVENTION

Figure 1:
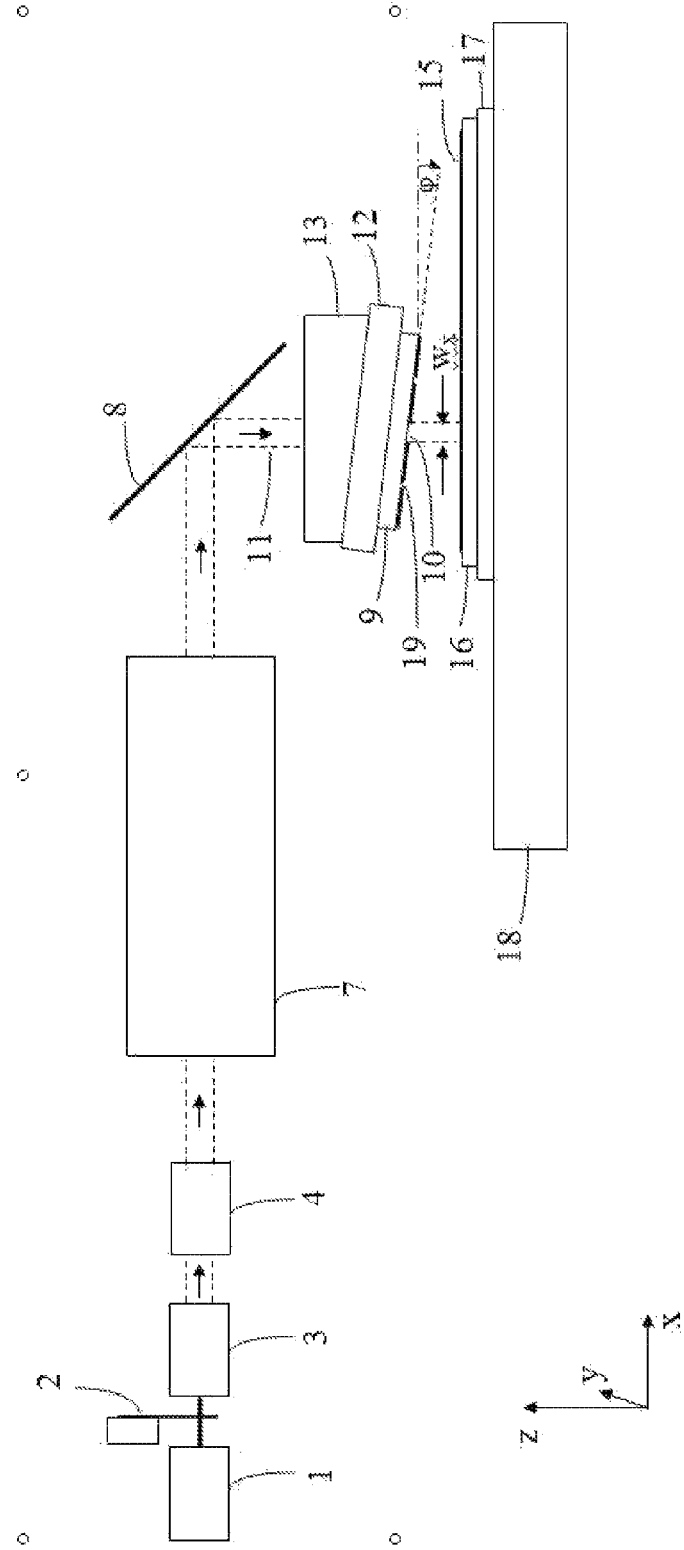
FIG. 1 illustrates a first embodiment of the invention.

In a first embodiment of the invention, with reference to FIG. 1, a photomask 9 bears a one-dimensional periodic pattern 10 of alternating opaque lines and transparent spaces with a period of 1 µm. The area of the pattern 10 is 2 mm×100 mm ($l_x \times l_y$), and lines and spaces of the pattern 10 are oriented parallel with the xz plane. The mask 9 has been manufactured using standard mask making techniques, the lines of the pattern being formed in a layer of chrome on a transparent substrate. The surface of the mask 9 surrounding the pattern 10 is also covered in chrome. The mask 9 is held by a vacuum chuck 12 with a central aperture that allows the mask pattern 10 to be illuminated from above by an exposure beam 11. The mask chuck 12 is mounted to a positioning system 13 which incorporates actuators that enable the mask 9 to be accurately positioned in relation to a larger, photoresist-coated substrate 16 of dimensions 250 mm×100 mm ($L_x \times L_y$) that is located on a vacuum chuck 18 below the mask 9; specifically, it enables the mask 9 to be positioned in proximity to the substrate 16, with a desired tilt angle, $\phi$, in the xz plane with respect to the substrate 16 and substantially parallel to it in the orthogonal yz plane.

The pattern 10 in the mask 9 is illuminated by a beam of substantially collimated light 11 with a wavelength of 363.8 nm that is derived from an argon-ion laser 1. The beam from the laser 1 is in TEM00 mode (i.e. has a Gaussian intensity profile), has a diameter of ~2 mm ($1/e^2$ value) and is linearly polarized parallel to the z-axis. A shutter 2 located in the beam path after the laser 1 allows the beam to be blocked before and after the exposure operation. With the shutter open, the beam is incident, firstly, on a first beam-expander 3 comprising concave and convex lenses that enlarge the beam diameter. This beam is then incident on a refractive beam-transformer 4 that redistributes the beam's intensity so that the intensity of the collimated output beam is substantially uniform over its circular cross-section. A suitable beam-transformer 4 is one of the piShaper range of products available from the company MolTech GmbH. The output beam then passes through a second beam-expander 7 comprising a pair of cylindrical lenses that expands the beam in the xy plane, which is subsequently reflected by a mirror 8, to produce a beam that is substantially uniform over an elliptical cross-section that has dimensions ~6 mm×110 mm ($w_x \times w_y$). The cross-section of the beam 11 provides a substantially uniform illumination of the mask pattern 10. The light-field transmitted and diffracted by the mask pattern 10 forms a set of self-images of the pattern 10, whose planes are parallel to the mask 9 and longitudinally separated by a Talbot distance. Because of the uniform illumination of the mask pattern 10, the presence of the chrome on the mask 9 surrounding the pattern 10, and the values selected for the width of the mask pattern 10 and the separation of the mask 9 and substrate 16, the intensity envelope of the light-field in the xz plane exposing the photoresist 15 is substantially rectangular (there is insignificant distortion by Fresnel diffraction).

Using the positioning system 13, the tilt angle, $\phi$, between the mask 9 and substrate 16 is arranged so that their separation changes by substantially an integer multiple, N (including N=1), of the Talbot distance, T over the width, $w_x$, of the pattern 10 in the xz plane. This may be mathematically expressed as $$\phi \approx NT/w_x \quad \text{equ. (2)}$$

In fact, when N is large, this requirement (that the change in separation over the width of the pattern in the xz plane corresponds substantially to an integer multiple of the Talbot distance) can be relaxed such that non-integral, intermediate values of N may also be used. The maximum value of N for which substantially integral values should be applied in equ. (2) depends on the requirements of the application concerned, especially with respect to the desired uniformity and reproducibility of the printed pattern; however, it may be, for example, 5.

For a linear grating of lines and spaces the Talbot distance is related to the grating period, p, and to the exposure wavelength, $\lambda$, by $$T \approx 2p^2/\lambda \quad \text{equ. (3)}$$

Evaluating this with p=1 µm and $\lambda$=364 nm yields T=5.5 µm. So, if tilt angle of the mask 9 is arranged so that the separation between the mask 9 and substrate 16 varies by a single Talbot distance over the beam-width of ~2 mm, then the tilt angle required is ~3 mR. The mask positioning system 13 is employed also to adjust the position of mask 9 so that it substantially parallel to the substrate 16 in the orthogonal yz plane. The tilt and parallelism in the xz and yz planes respectively between the mask 9 and substrate 16 may be measured and verified by illuminating them with a narrow beam from, for example, a HeNe laser (the photoresist is insensitive to the 633 nm-wavelength light from this laser) and determining the angular divergence between the beams reflected from the mask 9 and substrate 16. The separation between the mask 9 and substrate 16 at the centre of the pattern 10 is adjusted to ~200 µm, which may be performed using reference gauges of known thickness to measure the separation between the mask 9 and substrate 16 at the edges of the mask 9. An interferometric measurement system, particularly one based on white light interferometry, may alternatively be employed to more accurately measure the local separation of the mask 9 and substrate 16 at different locations across the mask 9, which enables the mask positioning system 13 to more accurately adjust the position of the mask 9 with respect to substrate 16. The width of the mask 9 in the x-direction and the location of the pattern 10 in the mask 9 have been previously arranged in relation to the tilt angle and the separation of mask 9 and substrate 16 in order to avoid contact between the mask 9 and substrate 16 during both the mask positioning and exposure operations.

The vacuum chuck 17 holding the photoresist-coated substrate 16 has been fabricated so that its vacuum surface is flat to <±10 µm. The chuck 17 is mounted to a motorized single-axis translation stage 17 with a travel range sufficient for enabling it to be displaced by its entire length below the pattern 10 in the mask 9. The stage 18 has been designed and selected to ensure, firstly, that the yawing motion during its displacement is <±50 µR; secondly, to ensure that the rolling motion of the substrate 16 over a displacement distance corresponding to the width of the mask pattern 10 is negligible; and thirdly that y-direction jitter during stage displacement is negligible. The displacement axis of the substrate stage 18 has been previously aligned parallel to the x-axis with an accuracy of <±25 µR, so that the substrate 16 displaces parallel to the lines of the mask pattern 10. This alignment may be performed by, firstly, loading onto the chuck 17 a substrate with instead a reference mark formed on its upper surface; secondly, displacing the chuck 17 so that the reference mark is located below successively a first alignment mark 19 and then a second such mark included on the mask substrate, the two alignment marks having been formed during the manufacture of the mask 9 so that they are located on an axis parallel to the lines of the mask pattern 10; measuring, using microscopes with integrated CCD detection (not indicated in the FIG. 1) together with image processing, the relative locations of the alignment and reference marks in each overlaid pair (the microscopes may be introduced close to the alignment marks by removing, or sliding, the mirror 8 away from its position above the mask positioning system 13); and, lastly, rotating the mask 9 about the z-axis, using the mask positioning system 13, so that the displacement axis of the translation stage 18 is rendered parallel to the xz plane. For this operation it is particularly advantageous that dual-focus microscopes are employed to view the reference and alignment marks, so that sharp images may be simultaneously formed of both whilst being longitudinally separated by ~200 µm.

The photoresist-coated substrate 16 is exposed by displacing it with a substantially constant speed using the translation stage 18 whilst illuminating the mask pattern 10 with the exposure beam 11. Because of the magnitude of the tilt in the xz plane between the mask 9 and substrate 16, each incremental strip of the photoresist layer across the substrate 16 in the y direction is exposed to the entire range of transversal intensity distributions between successive Talbot planes. Moreover, because of the rectangular intensity profile in the xz plane of the light transmitted by the mask pattern 10, each incremental strip receives an equal exposure from each of the transversal intensity distributions across the range. Hence, the time-integrated exposure across each strip of photoresist is equivalent to that produced by an exposure according to the DTL technique in which the substrate displaces towards the mask with constant speed and by the Talbot distance during the exposure; and therefore the pattern printed into each strip is the same: a linear grating with a period that is half that of the pattern 10 in the mask 9. As for the DTL and ATL techniques the integrated intensity distribution has a large depth of focus, which enables the half-period grating to be printed uniformly over the area of the substrate 16. The angular alignment arranged between the translation axis of the stage 18 and the lines of the mask pattern and the maximum yaw angle of the stage during its translation ensure that the lateral displacement of each point of the substrate, as it passes below the lines of the mask pattern 10, is ≤50.15 µm which permits the 0.25 µm lines of the printed pattern to be well resolved. The intensity of the illumination beam 11 and speed of the substrate 16 during the exposure are selected and optimized with respect to the photoresist process using standard methods for evaluating the patterns formed in the developed photoresist.

It should be noted that in this and later embodiments, the displacement of the substrate 16 during the exposure also serves to reduce the effects of speckle in the illumination beam 11 caused by the beam's high coherence and by particles and defects on the various optical surfaces: each point of the photoresist is exposed to a moving speckle pattern, and intensity modulation introduced by the speckle is time-averaged to a constant value.

Figure 2:
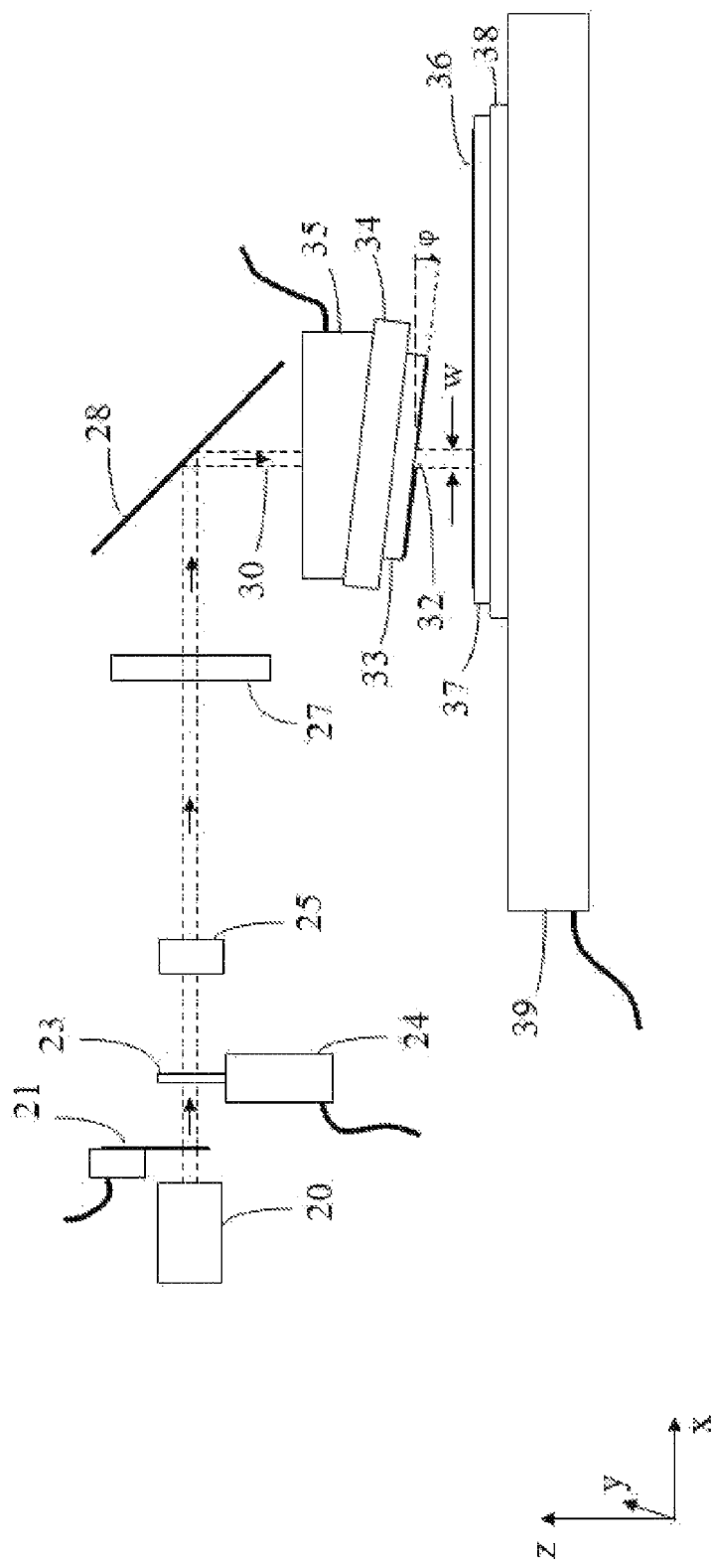
FIG. 2 illustrates a second embodiment of the invention.

In a second embodiment, with reference to FIG. 2, an argon-ion laser 20 emits a beam of light in TEM00 mode (i.e. with a Gaussian intensity profile) that has a diameter of ~2 mm ($1/e^2$ value) and is linearly polarized parallel to z-axis. A shutter 21 located in the beam path after the laser 20 allows the beam to be blocked before and after the exposure operation. With the shutter 21 open, the beam is incident, firstly, on a line diffuser 23 that scatters the light substantially uniformly over a narrow range of angles of ~±1° in the xy plane. Such a diffuser 23 may be obtained from the company RPC Photonics. The diffuser 23 is mounted to a motorized translation stage 24 for displacing the diffuser 23 in the y-direction. The scattered light from the diffuser 23 illuminates an array of cylindrical fly's-eye micro-lenses 25 oriented so that they refract the light in the xy plane. The fly's-eye, or tandem, micro-lens array comprises a pair of cylindrical micro-lens arrays arranged in series their separation being such that the first array focuses the light onto the second array. This arrangement of micro-lenses produces an output beam that has a substantially uniform intensity distribution over a range of angles of ~10° in the xy plane, and that remains substantially collimated with a Gaussian intensity distribution in the orthogonal, xz plane (it should be noted that the size of the beam and its degree of collimation in this plane may be adapted in other embodiments by including a cylindrical beam expander in the apparatus that changes the beam dimension after the laser in the xz plane). Due to the high coherence of the laser beam and the diffuser the intensity of the diverging beam is, however, modulated by a high-contrast speckle pattern. This though can be effectively eliminated during the exposure by continuously displacing the line-diffuser 23 using the translation stage 24 to generate a substantially uniform time-integrated distribution. The divergent beam from the fly's-eye micro-lens array 23 is incident on a cylindrical lens 27 that collimates the light in the yx plane to produce a beam 30, which after reflection from a mirror 28, has a rectangular cross-section of dimensions >2 mm×100 mm ($w_x \times w_y$), whose intensity distribution is substantially uniform in the yz plane and Gaussian in the orthogonal, xz plane.

This beam 30 is incident on a mask 33 bearing a 1 µm-period grating pattern 32 with an area ~4 mm×100 mm ($l_x \times l_y$) whose lines and spaces are parallel to the xz plane. The illumination beam 30 is centred on the mask pattern 32. The light-field transmitted and diffracted by the mask pattern 32 forms a set of self-images whose planes are parallel to the mask 33 and longitudinally separated by a Talbot distance. Due to the Gaussian intensity profile in the xz plane of the beam 30 illuminating the mask 33 and the relative dimensions of the beam 30 and pattern 32 in this plane, the intensity envelope of the transmitted light-field exposing the photoresist 36 in this plane is necessarily also Gaussian.

As in the first embodiment, the mask 33 is held by a vacuum chuck 34 which is mounted to a mask positioning system 35 that allows the mask 33 to be tilted in the xz plane and arranged substantially parallel in the yz plane with respect to a photoresist-coated substrate 37 located below the mask 33. The illuminated grating pattern 32 produces a set of diffraction orders in the transmitted light-field which interfere to generate self-images of the mask pattern 32 that are parallel to the mask 33 and longitudinally separated by a Talbot distance. The tilt angle between the mask 33 and substrate 37 is preferably arranged so that separation between the mask 33 and the substrate 37 over the FWHM value of beam-width in the x direction changes by at least the Talbot distance, T. Since the FWHM width, $w_{FWHM}$ of a Gaussian profile is related to its $1/e^2$ width, $w_x$, by $w_{FWHM} \approx 0.6 w_x$, the mask should therefore be tilted by an angle $$\phi \geq T/0.6 w_x \qquad \text{equ. (4)}$$

Thus, for a $1/e^2$-width of ~2 mm and a Talbot distance of 5.5 µm (in the case of a 1 um-period grating illuminated by 364 nm wavelength), the minimum tilt angle required is ~4.6 mR. This tilt angle, as well as parallelism in the yz plane and a ~200 µm gap between the mask 33 and substrate 37, are obtained using the positioning system 35 and the same measurement techniques as described in the first embodiment.

The photoresist-coated substrate is held by a flat vacuum chuck 38 mounted to a motorized, single-axis translation stage 39 for displacing the substrate 37 in the x direction. The stage's axis of translation is aligned parallel to the x-axis using reference and mask alignment marks and the same procedures as employed in the first embodiment. The substrate 37 is printed by displacing it in the x-direction with substantially constant speed whilst exposing the mask 33 to the illuminating beam 30. Because of the magnitude of the tilt between the mask 33 and substrate 37 in the xz plane, each incremental strip of the photoresist layer parallel to the y-axis is exposed to a sequence of changing transversal intensity distributions, as it displaces through the transmitted light-field, which is greater than that between successive Talbot planes. Furthermore, because of the Gaussian intensity profile of the illumination beam 35 in the xz plane, each incremental strip is exposed to a Gaussian variation of incremental exposure as it displaces through the transversal intensity distributions. Hence, the time-integrated exposure across each strip of photoresist is equivalent to that produced using a teaching of International pat. appl. PCT/IB2011/054509 in which the separation between the mask and substrate is changed with a varying speed during exposure such that the substrate is exposed to a substantially Gaussian variation of incremental exposure dose with changing separation; and consequently the pattern printed into each strip is a linear grating with half the period of the pattern 32 in the mask 33 whose line-widths are substantially insensitive to variations of the local separation of the mask 33 and substrate 37 during the exposure and to deviations of the tilt angle from the desired value. Illuminating the mask 33 with a beam having a Gaussian intensity profile in the xz plane consequently enables the half-period grating pattern to be printed more uniformly and more reproducibly onto substrates that have poor flatness.

Consistent with the teaching of Ser. No. 12/903,389, it is not necessary that the intensity profile employed in the second embodiment and the above-described related embodiments is exactly Gaussian, but may only approximate, or be similar, to it; for example, a truncated-Gaussian profile, a truncated-cosine profile or a truncated-triangular profile may be employed.

In a variant of the first or second embodiment, a mask bearing a quasi-periodic linear grating is instead introduced into the exposure apparatus concerned, and orientated so that the lines of the grating are parallel to the xz plane. The period of the quasi-grating is not constant across the mask pattern but varies slowly such that any part of the self-image in the transmitted light-field is formed from a part of the pattern in which the period is substantially constant. The tilt angle of the mask is preferably arranged so that the condition defined by equ. (2) or (4) respectively is satisfied for the largest value of the period in the mask.

In yet another variant of the first or second embodiment, the mask bears a plurality of sub-patterns, each of which is a linear grating with a constant period, and having a range of significantly different periods. The lines of the different sub-patterns are parallel and the sub-patterns are arranged in a row in a direction orthogonal to the lines. The dimensions of the complete pattern ($l_x \times l_y$) are not greater than those of the pattern in the respective first or second embodiment. The mask is introduced into the exposure apparatus concerned so that the lines of the sub-patterns are parallel to the xz plane. The tilt angle of the mask is preferably arranged so that the condition defined by equ. (2) or (4) respectively is satisfied for the largest value of the period in the mask. The sub-patterns are simultaneously illuminated by the illumination beam and the half-period sub-patterns are simultaneously printed onto the substrate as it displaces below the mask. For exposing a mask pattern containing sub-patterns having a range of significantly different periods, it is particularly advantageous that the intensity profile of the illumination beam in the xz plane is substantially Gaussian, although other similar profiles may be alternatively employed.

Figure 3:
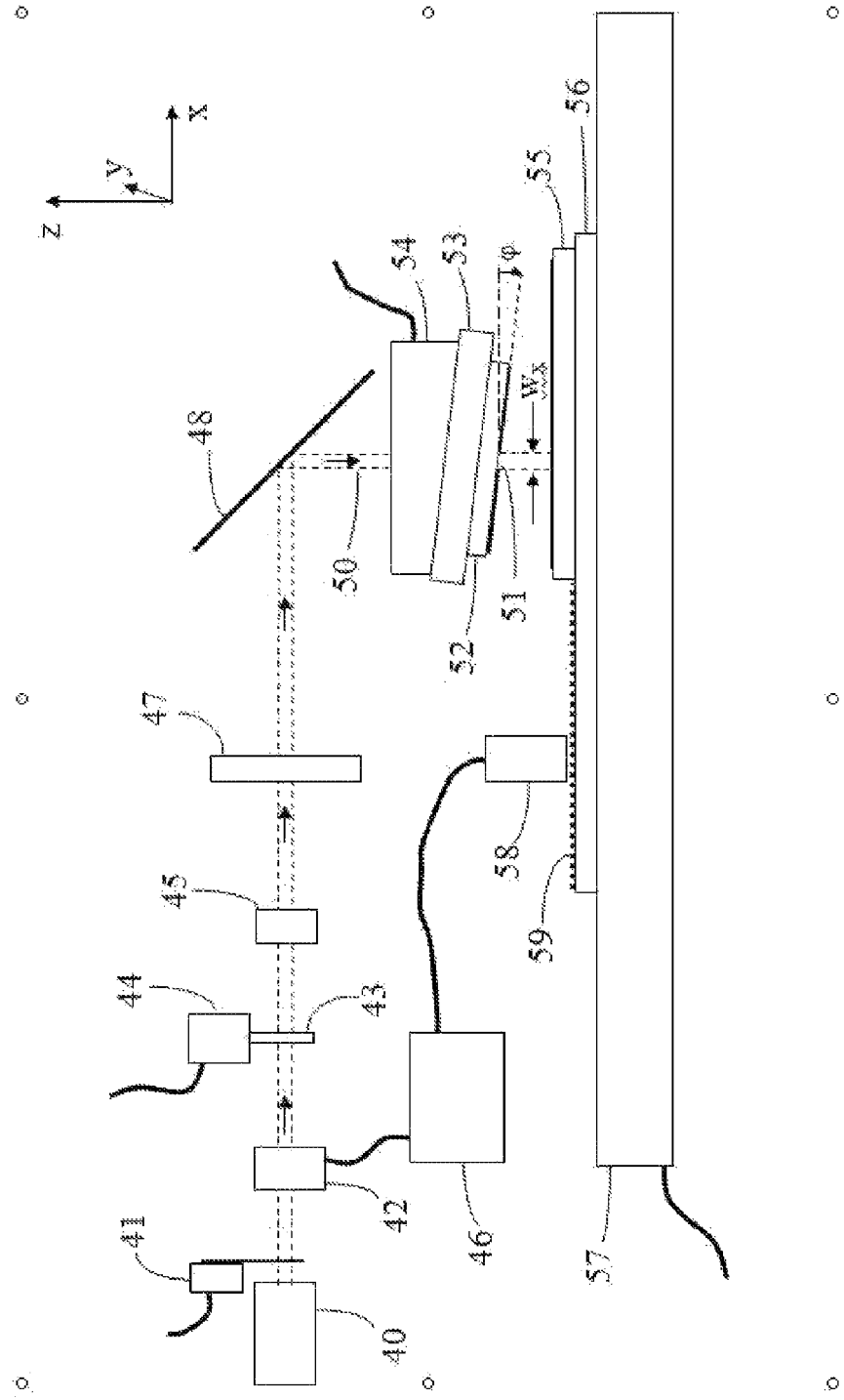
FIG. 3 illustrates a third embodiment of the invention.

In a third embodiment, with reference to FIG. 3, a mask 52 bears a 1 µm-period linear grating pattern 51 with dimensions 4 mm×30 mm ($l_x \times l_y$), whose lines and spaces are orientated parallel to the y-axis. The mask 52 is illuminated by a beam of collimated light 50 at the same wavelength as the earlier embodiments. The beam has a Gaussian intensity and a beam-width of 2 mm ($1/e^2$ value) profile in the xz plane, and a rectangular intensity profile and a beam length of 40 mm in the yz plane. It is likewise derived from an argon-ion laser 40 followed by a similar beam-shaping optical system as in the second embodiment, comprising a shutter 41, a line diffuser 43 mounted to a translation stage 44, a cylindrical fly's-eye micro-lens array 45 and a cylindrical lens 47 for collimating light diverging from the fly's-eye array 45 in the xy plane, which function in the same manner as in the previous embodiment. Also included in the optical system is an acousto-optic modulator 42 for modulating the intensity of the exposure beam 50 so that the mask is exposed to pulses of light that are delivered with a required repetition rate and a required duty cycle. The light-field transmitted and diffracted by the mask pattern 51 forms a set of self-images whose planes are parallel to the mask 52 and longitudinally separated by a Talbot distance.

As in the earlier embodiments, the mask 52 is held by a vacuum chuck 53 mounted to a mask positioning system 54 that enables the mask pattern 52 to be positioned accurately with respect to a photoresist-coated substrate 55 located below the mask 52. The mask 52 is tilted in the xz plane with respect to the photoresist-coated substrate 55 by the same angle of 4.6 mR as in the second embodiment so that the separation between the mask 52 and substrate 55 changes by a Talbot distance over the beam's FWHM dimension in the xz plane; and is arranged parallel with the substrate 55 in the yz plane, with separation of ~200 µm at the centre of the mask pattern 51.

Whereas the mask pattern 51 of this embodiment diffracts light in the xz plane, the angles of the diffracted orders and the separation of the mask pattern 51 and substrate 55 ensure that the intensity envelope of the light-field exposing the photoresist in the xz plane is substantially Gaussian with the same FWHM value as that illuminating the mask. It should be noted that in this embodiment the self-images and the intermediate transversal intensity distributions between Talbot planes are orientated such that their high-spatial-frequency intensity modulations are also in the xz plane, though lie within the above-mentioned Gaussian envelope of the intensity distribution in this plane.

The photoresist-coated substrate 55, which has dimensions 250 mm×50 mm ($L_x \times L_y$), is held on a vacuum chuck 56 that is mounted to a translation stage 57. The stage has been designed and selected so that the component of substrate displacement at the edges of the printed pattern caused by yawing is negligible in relation to the period of the printed pattern. The translation axis of the stage 57 is arranged substantially orthogonal to the lines of the mask pattern 51. Also mounted to the chuck plate 56 is an optical encoder 59 that displaces with the substrate 55 on the translation stage 57. An optical read-head 58 located above the encoder 59 together with associated signal processing (of the type described in greater detail in Gamet et al.) enables the displacement speed of the substrate 55 to be accurately measured. The measured speed serves to control, via a modulation control system 46, the repetition rate and duty cycle of the acousto-optic modulator, and therefore the pulsing characteristics of the exposure beam 50.

The photoresist-coated substrate 55 is exposed by displacing it at a substantially constant speed below the tilted mask 51 whilst illuminating the mask 51 to the intensity-modulated beam 50. The frequency and duty cycle the pulsed illumination are continuously controlled in a feed-back loop between the read-head 58 and the acousto-optic modulator 42, so that the substrate 55 displaces by the period of the printed pattern between successive pulses. So, if the period of the printed grating is 0.5 µm and the displacement speed of the substrate is 1 mm/s, then the acousto-optic modulator should pulse the illumination beam with a frequency of 2 kHz. The duty cycle of the pulsing (ratio of duration of pulses to pulse period) is preferably <0.25 so as not to unacceptably degrade the resolution of the printed pattern. Since the period of the printed grating, $p_{pr}$, is half the period of the grating pattern 51, this ensures that the lines of the grating printed by successive pulses of the illumination beam 50 are accurately superposed on the translating substrate 55. The pulse frequency may alternatively be selected so that the substrate 55 displaces by a multiple number of periods of the printed pattern (i.e. $2p_{pr}$, $3p_{pr}$, . . . ) between successive pulses, in which case the duty cycle should be proportionately less so as to retain the resolution of the printed pattern. The frequency of the pulsing should be sufficient for each point of the photoresist to be exposed to preferably at least 10 pulses of illumination so that there is sufficient sampling of the range of transversal intensity distributions between Talbot planes.

As for the second embodiment, the combination of the tilted mask 52 and substantially Gaussian intensity profile of the illumination beam 50 in the xz plane results in each strip of photoresist in the y direction across the substrate 55 being exposed to a sequence of changing transversal intensity distributions, as it displaces through the transmitted light-field, that is greater than that between successive Talbot planes, and to a Gaussian variation of incremental exposure, and therefore uniformly prints a grating with half the period of that in the mask 52 over the surface of the substrate 55.

Whereas the laser source employed in this embodiment produces a continuous-wave beam which is then converted into a pulsed beam by an external modulator, in other, related embodiments the intensity modulation may instead be produced by an intensity modulator integrated within the laser itself. For example, a frequency-tripled DPSS laser may be used that produces a beam of pulsed light at a wavelength of 355 nm.

In variants of the above embodiments the exposure is alternatively and equivalently performed by displacing both the mask and illumination beam with substantially constant speed in the x-direction over a distance corresponding to the length of the substrate whilst the photoresist-coated substrate is stationary during the exposure. In these embodiments the mask positioning system 13, 35, 54 respectively and the large, fold mirror 8, 28, 48 respectively are mounted to a long-travel translation stage whereas the photoresist-coated substrate is held by an immobile vacuum chuck.

In a variant of the third embodiment above, the lines of a one-dimensional grating pattern in the mask are orientated neither parallel to the y-axis nor parallel to the xz plane but at an intermediate, oblique angle between the two; for example, they are at an angle of 45° with respect to the y-axis. In this embodiment the pulse frequency of the illumination should be selected in relation to the translation speed of the substrate stage so that substrate displaces by an integer multiple of the distance $p_{pr}/\cos \omega$, where $\omega$ is the angle between the lines and the y-axis, between successive pulses.

In another variant of the third embodiment, sensors are additionally mounted to the translation stage system for accurately measuring any yaw of the chuck during its translation (of the type described in more detail in WO 2010/060741 A1), which motion is then compensated, in a continuous feed-back loop during the exposure, by suitable rotation of the mask pattern by its position stage. This can be advantageous for further improving the line-width uniformity of the printed pattern, and especially for patterns that have a large dimension in the yz plane.

In the above embodiments, it is preferable that the period of the printed pattern be much smaller than the dimension of the illumination beam in the xz plane over which the separation of the mask and substrate changes by one Talbot period, T, i.e. $p_{pr} \ll T/\phi$.

In a fourth embodiment of the invention, a mask with a two-dimensional periodic pattern of features is introduced instead as the mask 52 in the exposure apparatus of FIG. 3. The pattern comprises an array of holes arranged on a hexagonal grid with a nearest-neighbour distance of 1 μm that has been formed in a layer of chrome on a fused-silica substrate. The dimensions of the pattern are again 4 mm×30 mm ($l_x \times l_y$). The pattern design and mask orientation are further arranged so that one of the three axes of the hexagonal pattern (the axes being parallel to lines joining the centres of nearest-neighbour features) is parallel to the translation axis of the stage 57. The angular alignment of the mask axis with the stage axis is obtained, as in the third embodiment, with the aid of additional alignment marks included in the mask, a reference mark on a dedicated substrate loaded onto the chuck 56, and alignment microscopes for viewing the alignment and reference marks. The mask is likewise tilted in the xz plane with respect to the photoresist-coated substrate so that separation between the mask and the substrate changes by at least the Talbot distance, for the pattern concerned, across the FWHM dimension of the beam in the xz plane. In the case of a two-dimensional mask patterns it is further advantageous that the beam illuminating the mask be either un-polarized or circularly polarized so as not to introduce asymmetry into the efficiencies of the diffracted orders. For this purpose, a quarter-wave retarder may be, for instance, included in the beam-path after the laser 40 in order to produce a circularly polarized beam. Exposure is performed in the same manner as the third embodiment, by displacing the photoresist-coated substrate parallel to the axis of the mask pattern whilst pulsing the illumination at a frequency such that the substrate displaces between successive pulses by a distance corresponding to the nearest-neighbour distance of the printed pattern (or multiples thereof).

Figure 4:
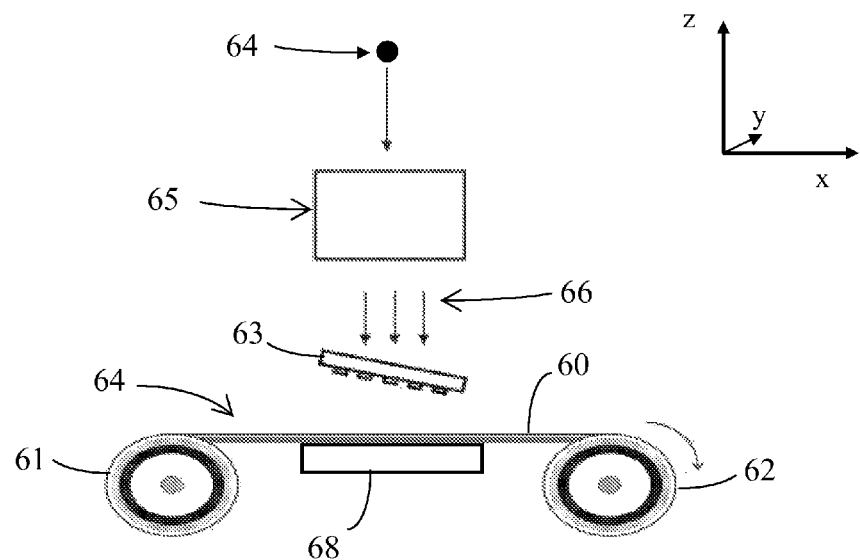
FIG. 4 illustrates a fifth embodiment of the invention.

In a fifth embodiment, with reference to FIG. 4, the photosensitive layer is coated onto a flexible substrate such as a plastic film 60, which is loaded onto rollers 61, 62 for displacing below a tilted mask 63 using a motorized roll-to-roll mechanism 64. The light source 64 and optical system 63 generate a beam of collimated light 66, which has a beam-shape with a FWHM beam-width in the xz plane and a substantially uniform distribution in the orthogonal yz plane, for illuminating the periodic pattern in the mask 63. The angle of tilt of the mask 63 with respect to the area of the film 60 being exposed is selected so that the change of separation across the FWHM of the beam profile in the xz plane corresponds to the Talbot distance of the periodic pattern in the mask 63. In order that the surface of the film 60 remains substantially flat and at a substantially constant distance from the mask 63 as it passes below it during exposure, the film 60 is lightly sucked, using low vacuum pressure, to the surface of a flat chuck 68.

Figure 5:
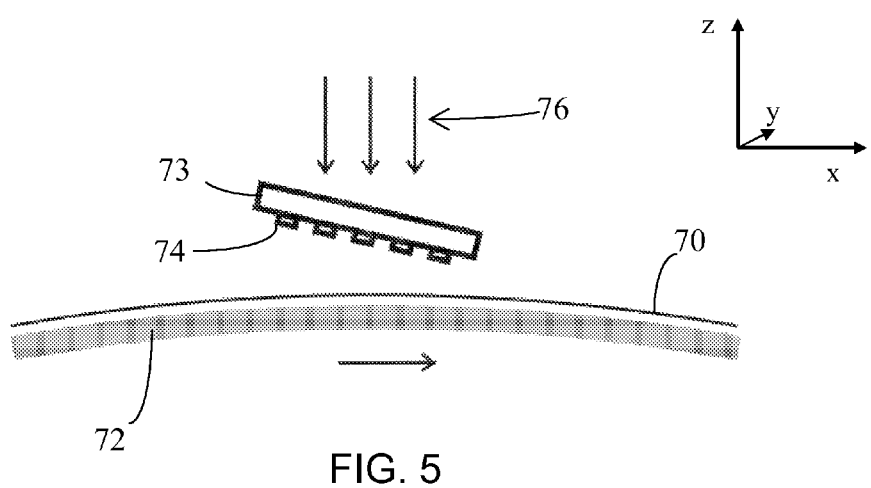
FIG. 5 illustrates an alternative substrate support employed in a variant of the fifth embodiment.

In a variant of this embodiment, with reference to FIG. 5, a flexible film 70 with a photosensitive layer on its upper surface is guided by a roll-to-roll mechanism (not shown) over the surface of a curved support 72 that has a curvature in the xz plane but is substantially flat in the orthogonal plane, such as a cylindrically curved surface. A mask 73 bearing a periodic pattern of features 74 is located above the curved support 72. A positioning system tilts the mask at an angle in the xz plane with respect to the film immediately below the pattern in the mask and positions the mask so that the centre of the pattern 74 has a required separation from the film 70. An illumination system of such a type described in the previous embodiments generates a beam of collimated light 76 for exposing the mask pattern 74. As the film is translated below the mask during exposure the guiding mechanism keeps the film 70 under light tension as it over the curved support 72, so that the separation and tilt angle of the mask pattern with respect to the part of the film being exposed remain substantially constant. This arrangement likewise serves to ensure that the film 70 is accurately positioned with respect to the mask 73 during the exposure so that the photosensitive layer is correctly exposed to the required integration of the transversal intensity profiles between Talbot planes.

In a sixth embodiment, a flexible film coated with photosensitive material is film is disposed around a cylindrical support. The cylinder's axis is arranged parallel to the y-axis of the illumination system employed in the first embodiment and positioned below the mask so that the surface of the film immediately below the mask pattern has the required tilt angle in the xz plane, is substantially parallel to the mask pattern in the yz plane, and is separated from the centre of the mask pattern by ~200 µm. Exposure is performed by rotating the cylindrical support so that the film is laterally displaced below the mask during its illumination.

Figure 6:
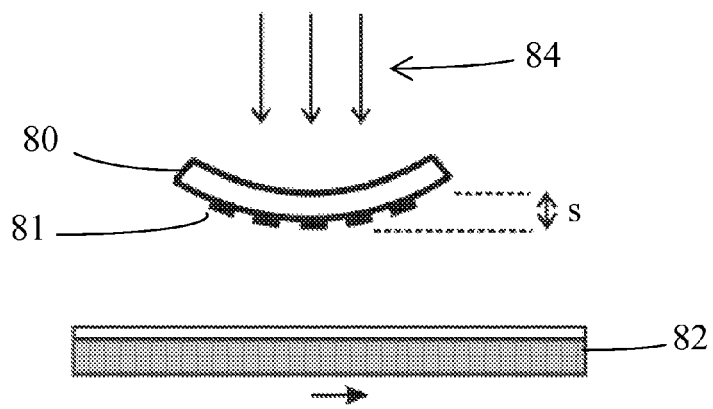
FIG. 6 illustrates a seventh embodiment of the invention.

In a seventh embodiment, with reference to FIG. 6, a mask 80 comprises a one-dimensional periodic pattern of lines and spaces 81 formed in an opaque material on a transparent substrate. The upper and lower surfaces of the mask 80 are substantially parallel to each other but cylindrical in shape. Such a mask may be formed by, for example, contact printing a pattern from a conventional, rigid mask onto a photosensitised plastic film followed by suitable post-exposure processing, and then mounted to a cylindrically-shaped glass support in the exposure system. The mask 80 is orientated so that the lines and spaces of the pattern 81 are parallel to the y direction, and is arranged in relation to a photoresist-coated substrate 82 mounted to a vacuum chuck located below the mask 80 so that the centre of the pattern 81 is substantially parallel to, and at a distance of 200 µm from the substrate 82. An illumination system generates a beam of collimated light whose beam-width in the xz plane is such that the change of separation, s, between the mask 80 and substrate 82 across the beam-width caused by the curvature of the mask 80 corresponds to at least the Talbot distance of the light-field generated by the periodic pattern in the mask 80. Exposure is performed by displacing the substrate 82 in the x direction whilst illuminating the mask with the collimated beam. Using a mask 80 that has cylindrical rather than flat surfaces mask has advantage that it reduces the risk of contact between, and consequent damage to, the mask and substrate, and thus permits a mask pattern. A cylindrical mask substrate therefore enables a smaller separation between the mask and the substrate. When using a mask pattern on a flat substrate that is tilted with respect to the photoresist-coated substrate, the dimension of the mask in the xz plane and the location of the pattern in the mask should be selected so as to ensure there is no contact or damage to the mask or photoresist-coated substrate during the exposure.

Figure 7:
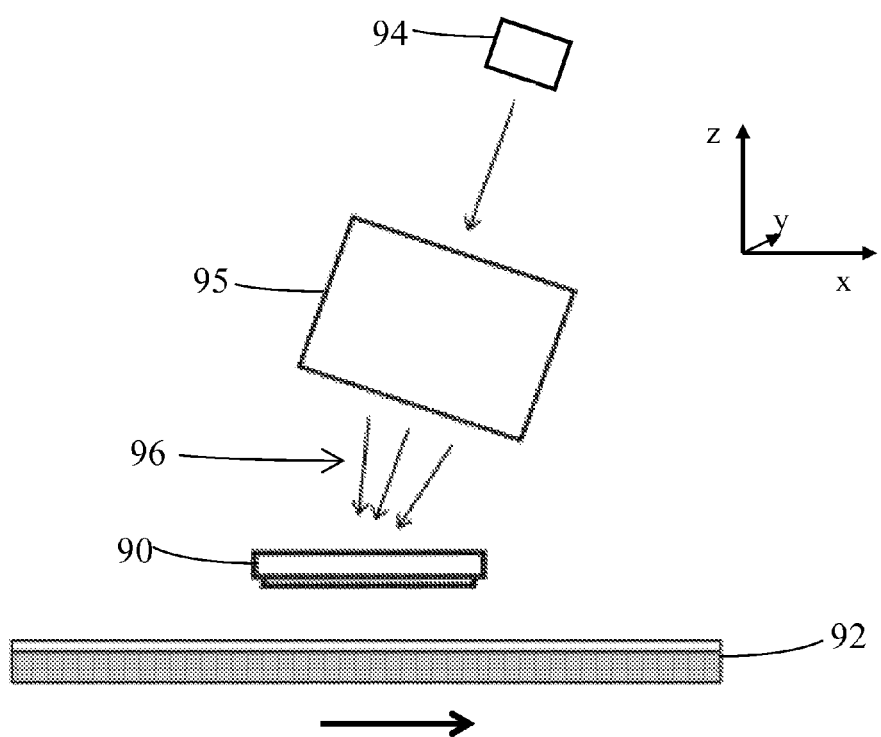
FIG. 7 illustrates an eighth embodiment of the invention.

In an eighth embodiment, with reference to FIG. 7, a mask 90 is arranged substantially parallel to the photoresist-coated substrate 92 in both xz and yz planes and with a required separation. A laser source 94 and optical system 95 form an exposure beam 96 that is collimated in the yz plane and whose intensity profile and width in that plane provides uniform illumination over the extent of the mask pattern in that direction. In the xz plane the optical system 95 generates a range of angles of incidence of the beam at the mask 90, which are selected according to the teaching of International pat. appl. PCT/IB2011/052977 so that the different angular components of the illumination beam exposes the substrate to an integrated intensity distribution that is substantially equivalent to that formed by the ATL or DTL techniques. The photoresist-coated substrate 92 is exposed by displacing it with substantially constant speed in the x-direction whilst illuminating the pattern in the mask 90 with the beam 96, so that a high-resolution grating pattern with a period that is half that of the mask pattern is uniformly printed over the substrate 92. In this embodiment the illumination may also be either continuous or pulsed from suitable lasers, though for the latter case the displacement of the substrate between successive pulses should be much smaller than $T/\phi$ in order that the integrated transversal intensity distribution exposing the substrate substantially corresponds to that produced by the DTL or ATL techniques. Synchronization of the pulses with the substrate displacement may be obtained using such mechanisms previously mentioned. It is also important that the yawing motion of the translation stage be sufficiently small or sufficiently compensated by such means as described earlier.

In another embodiment of the invention, the mask is tilted with respect to the mask as in the first embodiment and is illuminated by a range of angles as in the eighth embodiment but the degree of tilt and range of angles are reduced in relation to the respective values employed in those earlier embodiments so that the combination of the two produces the required integrated transversal intensity distribution at the photoresist-coated substrate during the scanning of the substrate with respect to the mask.

In other variants of the above or other embodiments of the invention the average distance between the mask and the substrate is adjusted and maintained with the help of a spacer. The spacer may have a wedge shape. The spacer may be located in an area outside the patterned area or in an area within the patterned region. In an embodiment the spacer is made of a material that is transparent to the wavelength of illumination.

Whereas in all the above embodiments photoresist-coated substrate displaces with a constant speed during the exposure, in other embodiments the substrate may displace with a variable speed in the x direction in order to, for example, produce a gradient of exposure from one end of the substrate to the other. In yet other embodiments, the substrate may be exposed with step-wise displacement of the stage rather than a continuous, smooth movement at a constant speed, the steps being small in relation to the beam size in the xz plane so that the desired integration of the transversal intensity distributions is obtained.

Whereas the light source employed in all the above embodiments is a laser, which is the preferred case, in other embodiments other types of source may be used, for example, a discharge source such as a mercury lamp whose output is spectrally filtered to provide a beam of substantially monochromatic light.

In variants of the above or other embodiments the gap between the mask and the substrate is filled with a liquid whose refractive index is greater than 1, for example water, in order to print gratings with higher resolution using a given illumination wavelength and also to improve the contrast of the integrated intensity distribution exposing the photoresist-coated substrate. Including liquid in the gap also reduces reflections from the mask and the substrate surfaces, and therefore improves the coupling of the light into the photosensitive layer.

In further variants of the above or other embodiments of the invention, the features in the mask pattern may be alternatively formed using at least one phase-shifting material on a transparent substrate, instead of by opening holes in a layer of chrome on a fused silica substrate in the case of an amplitude mask. In other embodiments, the mask includes partially absorbing and phase shifting regions.

The various embodiments of the present invention enable large-area one-dimensional and two-dimensional periodic patterns to be printed with high uniformity from a relatively small periodic pattern in a mask. Since the integrated transversal intensity distributions generated by the different embodiments are equivalent to the intensity distributions produced by the DTL and ATL techniques and their extended versions as described above, they have large depth of focus. The large depth of focus enables high-resolution patterns to be printed into thick photosensitive films; renders unnecessary the precise adjustment of the distance between the mask and the substrate; and enables patterns to be printed onto substrates that have large topographical features and onto non-flat substrates.

More generally, while the embodiments described above may be currently considered as preferred embodiments of the invention, it should, of course, be understood that various modifications and changes in form or detail could readily be made without departing from the spirit of the invention.

The invention claimed is:

1. A method for printing a desired pattern of periodic features into a photosensitive layer, which comprises the steps of:
   providing a substrate bearing the photosensitive layer;
   providing a mask bearing a mask pattern of periodic features;
   disposing the substrate in proximity to the mask so that the mask has a tilt angle with respect to the substrate in a first plane orthogonal thereto;
   providing substantially collimated light for illuminating the mask pattern to generate a transmitted light-field composed of a range of transversal intensity distributions between Talbot planes separated by a Talbot distance, and so that the transmitted light-field has an intensity envelope in the first plane;
   illuminating the mask with the substantially collimated light while displacing the substrate relative to the mask in a direction that is substantially parallel to both the first plane and the substrate, whereby the desired pattern is printed into the photosensitive layer; and
   forming the tilt angle and the intensity envelope in relation to the Talbot distance so that the photosensitive layer is substantially exposed to an average of the range of transversal intensity distributions.

2. The method according to claim 1, which further comprises forming the mask pattern with a one-dimensional pattern of parallel lines and spaces, and the substrate is additionally disposed so that the first plane is parallel to the parallel lines.

3. The method according to claim 1, which further comprises:
   forming the mask pattern with a one-dimensional pattern of parallel lines and spaces with a period;
   disposing the substrate so that the first plane is orthogonal to the parallel lines; and
   providing that the substantially collimated light illuminating the mask is delivered in pulses having a time-period that is selected so that the substrate displaces during the time-period by a distance equal to half the period or an integer multiple of half the period.

4. The method according to claim 1, which further comprises:
   forming the mask pattern with a one-dimensional pattern of parallel lines and spaces with a period;
   disposing the substrate so that the first plane is at an oblique angle with respect to the parallel lines; and
   providing that the substantially collimated light illuminating the mask is delivered in pulses having a time-period that is selected such that the substrate displaces during the time-period by a distance so that the parallel lines of the desired pattern printed by successive pulses onto the substrate are superposed.

5. The method according to claim 1, which further comprises:
   forming the mask pattern with a two-dimensional pattern of features having a period in a direction;
   disposing the substrate so that the first plane is parallel to the direction; and
   providing that the substantially collimated light illuminating the mask is delivered in pulses having a time-period that is selected such that the substrate displaces during the time-period by a distance that corresponds to a period or an integer multiple thereof.

6. The method according to claim 1, which further comprises:
   providing the intensity envelope to be substantially uniform across a beam-width; and
   setting the tilt angle to produce a substantially linear change of separation between the mask and the substrate across a beam-width that corresponds to the Talbot distance or an integer multiple thereof.

7. The method according to claim 1, which further comprises
   generating the intensity envelope to be substantially uniform across a beam-width; and
   setting the tilt angle to produce a substantially linear change of separation between the mask and the substrate across the beam-width that is much greater than the Talbot distance.

8. The method according to claim 1, which further comprises:
   generating the intensity envelope to be substantially Gaussian with a full-width half-maximum beam-width; and
   setting the tilt angle to produce a change of separation between the mask and the substrate across the beam-width that corresponds substantially to at least the Talbot distance.

9. The method according to claim 1, wherein the intensity envelope has a full-width half-maximum value, and the tilt angle is set to produce a change of separation between the mask and the substrate across a beam-width that substantially corresponds to at least the Talbot distance.

10. The method according to claim 1, wherein a displacement of the substrate relative to the mask is produced by an actual displacement of the mask and illuminating light, while the substrate remains stationary.

11. The method according to claim 1, which further comprises disposing the substrate substantially parallel to the mask in a second plane that is orthogonal to the first plane and to the substrate.

12. The method according to claim 1, wherein the periodic features of both the desired pattern and the mask pattern are exactly periodic or are quasi-periodic.

13. The method according to claim 1, wherein a desired pattern of periodic features contains a plurality of sub-patterns with different periods, the mask pattern contains a plurality of sub-patterns with different periods, wherein each of the sub-patterns generates a light-field composed of Talbot planes separated by the Talbot distance, and the tilt angle and the intensity envelope are set in relation to the Talbot distance of the light-field from the sub-pattern with a largest period.

14. The method according to claim 1, which further comprises introducing a fluid between the mask and the substrate.

* * * * *